United States Patent
Chang et al.

(10) Patent No.: US 11,437,386 B2
(45) Date of Patent: Sep. 6, 2022

(54) SYSTEM AND METHOD FOR REDUCING CELL AREA AND CURRENT LEAKAGE IN ANTI-FUSE CELL ARRAY

(71) Applicant: Taiwan Semiconductor Manufacturing Company Limited, Hsinchu (TW)

(72) Inventors: Meng-Sheng Chang, Chu-bei (TW); Chia-En Huang, Xinfeng Township (TW); Shao-Yu Chou, Chu Pei (TW); Yih Wang, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 355 days.

(21) Appl. No.: 16/786,499

(22) Filed: Feb. 10, 2020

(65) Prior Publication Data
US 2021/0249422 A1    Aug. 12, 2021

(51) Int. Cl.
| | |
|---|---|
| *H01L 27/112* | (2006.01) |
| *H01L 23/528* | (2006.01) |
| *H01L 23/532* | (2006.01) |
| *G11C 17/16* | (2006.01) |
| *G06F 30/392* | (2020.01) |
| *H01L 23/525* | (2006.01) |
| *G11C 17/18* | (2006.01) |

(52) U.S. Cl.
CPC ...... *H01L 27/11206* (2013.01); *G06F 30/392* (2020.01); *G11C 17/16* (2013.01); *G11C 17/18* (2013.01); *H01L 23/528* (2013.01); *H01L 23/5252* (2013.01); *H01L 23/53271* (2013.01)

(58) Field of Classification Search
CPC .......... H01L 23/5252; H01L 27/11206; H01L 2924/1453; H01L 27/112–11597
See application file for complete search history.

(56) References Cited

U.S. PATENT DOCUMENTS

2019/0251223 A1    8/2019 Chang et al.

*Primary Examiner* — Amar Movva
(74) *Attorney, Agent, or Firm* — Foley & Lardner LLP

(57) ABSTRACT

A memory device includes a first memory cell having a first polysilicon line associated with a first read word line and intersecting a first active region and a second active region, and a second polysilicon line and a first CPODE associated with a first program word line, the second polysilicon line intersecting the first active region and the first CPODE intersecting the second active region. The memory device also includes a second memory cell adjacent to the first memory cell, the second memory cell having a third polysilicon line associated with a second read word line and intersecting the first active region and the second active region, and a fourth polysilicon line and a second CPODE associated with a second program word line, the fourth polysilicon line intersecting the second active region and the second CPODE intersecting the first active region to form a cross-arrangement of CPODE.

20 Claims, 9 Drawing Sheets

SYSTEM AND METHOD FOR REDUCING CELL AREA AND CURRENT LEAKAGE IN ANTI-FUSE CELL ARRAY

BACKGROUND

The present disclosure relates generally to standard cell layout, and particularly to reducing overall cell area and current leakage between anti-fuse cells of an anti-fuse cell array.

Integrated circuits are widely used in a variety of applications. Designing an integrated circuit is a multi-step process. Specifically, the design of an integrated circuit begins with a description of the functionality desired from the integrated circuit. From the functional description, a transistor level circuit is designed and a netlist that defines the connectivity of the various transistors in the circuit is developed. The netlist may be simulated and tested to verify that the circuit implements the desired functionality, and to predict operating parameters. The netlist is then used to create a standard cell layout of the circuit. The standard cell layout includes a placement of standard elements or standard cells from a standard cell library, and shows how those cells are interconnected. An anti-fuse memory cell is one type of a standard element. However, present day anti-fuse memory cells have limitations in the way they are configured.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
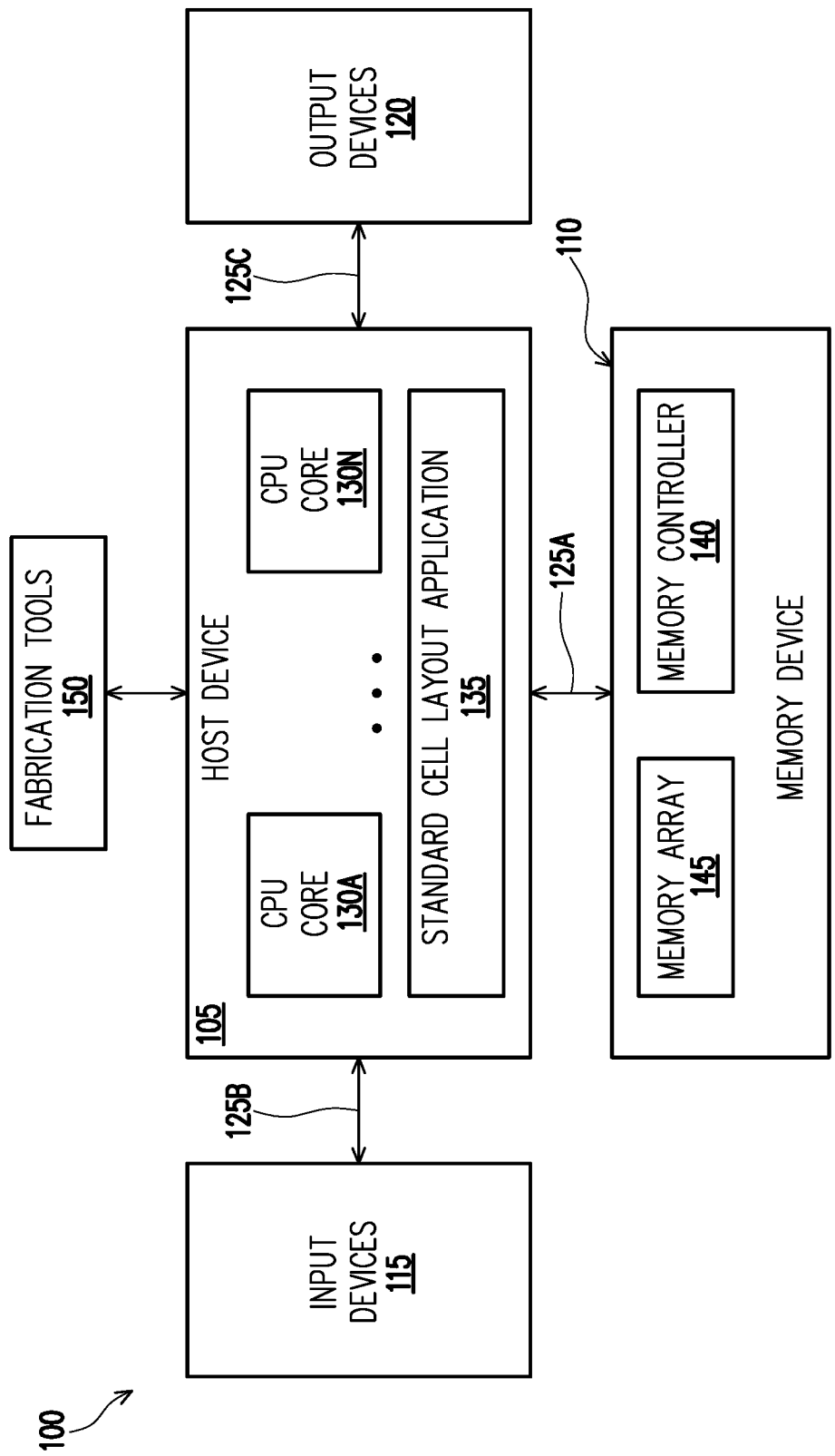
FIG. 1 is an example block diagram of a computing system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, an example block diagram of a computing system 100 is shown, in accordance with some embodiments of the disclosure. The computing system 100 may be used by a circuit or layout designer for performing a standard cell layout of a circuit. A "circuit" or "integrated circuit" as used herein is an interconnection of electrical components such as resistors, transistors, switches, batteries, inductors, or other types of semiconductor devices configured for implementing a desired functionality. The computing system 100 includes a host device 105 associated with a memory device 110. The host device 105 may be configured to receive input from one or more input devices 115 and provide output to one or more output devices 120. The host device 105 may be configured to communicate with the memory device 110, the input devices 115, and the output devices 120 via appropriate interfaces 125A, 125B, and 125C, respectively. The computing system 100 may be implemented in a variety of computing devices such as computers (e.g., desktop, laptop, servers, data centers, etc.), tablets, personal digital assistants, mobile devices, other handheld or portable devices, or any other computing unit suitable for performing standard cell layout using the host device 105.

The input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 105 and that allows an external source, such as a user (e.g., a circuit or layout designer), to enter information (e.g., data) into the host device and send instructions to the host device. Similarly, the output devices 120 may include a variety of output technologies such as external memories, printers, speakers, displays, microphones, light emitting diodes, headphones, video devices, and any other output peripherals that are configured to receive information (e.g., data) from the host device 105. The "data" that is either input into the host device 105 and/or output from the host device may include any of a variety of textual data, circuit data, signal data, semiconductor device data, graphical data, combinations thereof, or other types of analog and/or digital data that is suitable for processing using the computing system 100.

The host device 105 includes or is associated with one or more processing units/processors, such as Central Processing Unit ("CPU") cores 130A-130N. The CPU cores 130A-130N may be implemented as an Application Specific Integrated Circuit ("ASIC"), Field Programmable Gate Array ("FPGA"), or any other type of processing unit. Each of the CPU cores 130A-130N may be configured to execute instructions for running one or more applications of the host device 105. In some embodiments, the instructions and data needed to run the one or more applications may be stored within the memory device 110. The host device 105 may also be configured to store the results of running the one or more applications within the memory device 110. Thus, the host device 105 may be configured to request the memory device 110 to perform a variety of operations. For example, the host device 105 may request the memory device 110 to read data, write data, update or delete data, and/or perform management or other operations.

One such application that the host device 105 may be configured to run may be a standard cell layout application 135. The standard cell layout application 135 may be part of a computer aided design or electronic design automation software suite that may be used by a user of the host device 105 to create a standard cell layout (also referred to herein as "layout," "layout diagram," "layout design," and the like) of a circuit. A standard cell layout of the circuit may show various components/connections of the circuit to be fabricated. For example, the standard cell layout may show one or more active regions, gate electrodes, source and drain electrodes, metal lines, via contacts, openings for bonding pads, one or more metal layers, power sources, etc. representing the various components of the circuit, and how those components are interconnected when disposed in/on a semiconductor substrate (such as a silicon wafer). The standard cell layout may be implemented by following a design procedure that may include one or more of logic design, physical design, or place and route. The standard cell layout may be expressed in one or more data files such as GDSII file format or DFII file format. In other embodiments, other file formats may be used. Thus, using the standard cell layout application 135, a circuit designer may create a standard cell layout of a circuit. In some embodiments, the instructions needed to execute or run the standard cell layout application 135 may be stored within the memory device 110. The standard cell layout application 135 may be executed by one or more of the CPU cores 130A-130N using the instructions associated with the standard cell layout application from the memory device 110.

Referring still to FIG. 1, the memory device 110 includes a memory controller 140 that is configured to read data from or write data to a memory array 145. In some embodiments, the memory array 145 may be a one-time programmable ("OTP") memory array. The OTP memory array is a type of non-volatile memory that retains the data stored therein after the memory device 110 is powered off. In some embodiments, the OTP memory array may include a plurality of anti-fuse cells, each of which may be configured to store at least one bit of data. In some embodiments, the memory array 145 may additionally include other types of volatile and/or non-volatile memories. For example, in some embodiments, the memory array 145 may also include NAND flash memory cores, NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. Generally speaking, the memory array 145 may include any of a variety of Random Access Memory (RAM), Read-Only Memory (ROM), Programmable ROM (PROM), Erasable PROM (EPROM), Electrically EPROM (EEPROM), hard disk drives, flash drives, memory tapes, optical drives, cloud memory, or any combination of primary and/or secondary memory that is suitable for performing the operations described herein.

The memories within the memory array 145 may be individually and independently controlled by the memory controller 140. In other words, the memory controller 140 may be configured to communicate with each memory within the memory array 145 individually and independently. By communicating with the memory array 145, the memory controller 140 may be configured to read data from or write data to the memory array in response to instructions received from the host device 105. Although shown as being part of the memory device 110, in some embodiments, the memory controller 140 may be part of the host device 105 or part of another component of the computing system 100 and associated with the memory device. The memory controller 140 may be implemented as a logic circuit in either software, hardware, firmware, or combination thereof to perform the functions described herein. For example, in some embodiments, the memory controller 140 may be configured to retrieve the instructions associated with the standard cell layout application 135 stored in the memory array 145 of the memory device 110 upon receiving a request from the host device 105.

In some embodiments, the computing system 100 may also be associated with various fabrication tools 150. Among other things, the fabrication tools 150 may be used to prepare and fabricate a set of masks based on the standard cell layout created by the standard cell layout application 135. The set of masks may define the geometry for the photolithography steps used during semiconductor fabrication of the circuit. Although the fabrication tools 150 are shown separate from the host device 105, in some embodiments, at least some of the functionality of the fabrication tools may be implemented by the host device such as by the standard cell layout application 135 or another application associated with the standard cell layout application.

To prepare a set of masks, the fabrication tools 150 may be used to translate the standard cell layout of the circuit into a representative data file ("RDF"). The RDF may then be used to fabricate a set of physical masks to fabricate the circuit.

In some embodiments, preparing the set of masks may include performing an optical proximity correction (OPC) using lithography enhancement techniques to compensate for image errors, such as those that can arise from diffraction, interference, other process effects and the like, in the standard cell layout. In some embodiments, a mask rule checker (MRC) of the fabrication tools 150 may check the standard cell layout that has undergone processes in OPC with a set of mask creation rules. The mask creation rules may contain certain geometric and/or connectivity restrictions to ensure sufficient margins, to account for variability in semiconductor manufacturing processes, and the like. In some embodiments, the MRC may modify the standard cell layout to compensate for limitations during the fabrication of the set of masks. In some embodiments, preparing the set of masks may also include resolution enhancement techniques (RET), such as off-axis illumination, sub-resolution assist features, phase-shifting masks, other suitable techniques, and the like or combinations thereof.

The preparation of the set of masks may further include, in some embodiments, lithography process checking (LPC) that may simulate processes implemented to fabricate the circuit. LPC may simulate these processes based on the standard cell layout to create a simulated manufactured device of the circuit. LPC may take into account various factors, such as aerial image contrast, depth of focus ("DOF"), mask error enhancement factor ("MEEF"), other suitable factors, and the like or combinations thereof, to simulate the fabrication of the circuit. In some embodiments, after a simulated manufactured device has been created by LPC, if the simulated device does not satisfy certain design rules, OPC and/or MRC may be repeated to further refine the standard cell layout.

To fabricate the set of masks, a mask writer may convert the RDF to an image on a substrate, such as a mask (reticle) or a semiconductor wafer. In some embodiments, an electron-beam (e-beam) or a mechanism of multiple e-beams may be used to form a mask pattern on a semiconductor wafer to form the mask. In some embodiments, the mask pattern may include one or more opaque regions and one or more transparent regions. A radiation beam, such as an ultraviolet (UV) beam, used to expose the image sensitive material layer (e.g., photoresist) which has been coated on the semiconductor wafer, may be blocked by the opaque regions and transmits through the transparent regions. In one example, the mask pattern may include a transparent substrate (e.g., fused quartz) and an opaque material (e.g., chromium) coated in the opaque regions to form the mask. In other embodiments, other or additional techniques may be used to fabricate the masks.

Once the masks are fabricated, a fabrication entity (e.g., a manufacturing facility or semiconductor foundry) may use the fabricated masks to fabricate the circuit. In some embodiments, fabricating the circuit may involve depositing one or material in/on a semiconductor wafer using the mask (or masks). The semiconductor wafer may include a silicon substrate or other substrate having material layers formed thereon. The semiconductor wafer may further include one or more of various doped regions, dielectric features, multilevel interconnects, and the like formed using one or more of the masks.

It is to be understood that although the fabrication tools 150 are described as performing certain operations for preparing the set of masks and then fabricating the set of masks, in some embodiments, the various processes may vary from those described. In some embodiments, additional or other processes or operations may be used to prepare the set of masks and fabricate the set of masks. It is also to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the memory controller 140 and the memory array 145 may include other hardware, software, and/or firmware components that are considered necessary or desirable in performing the functions described herein.

Figure 2:
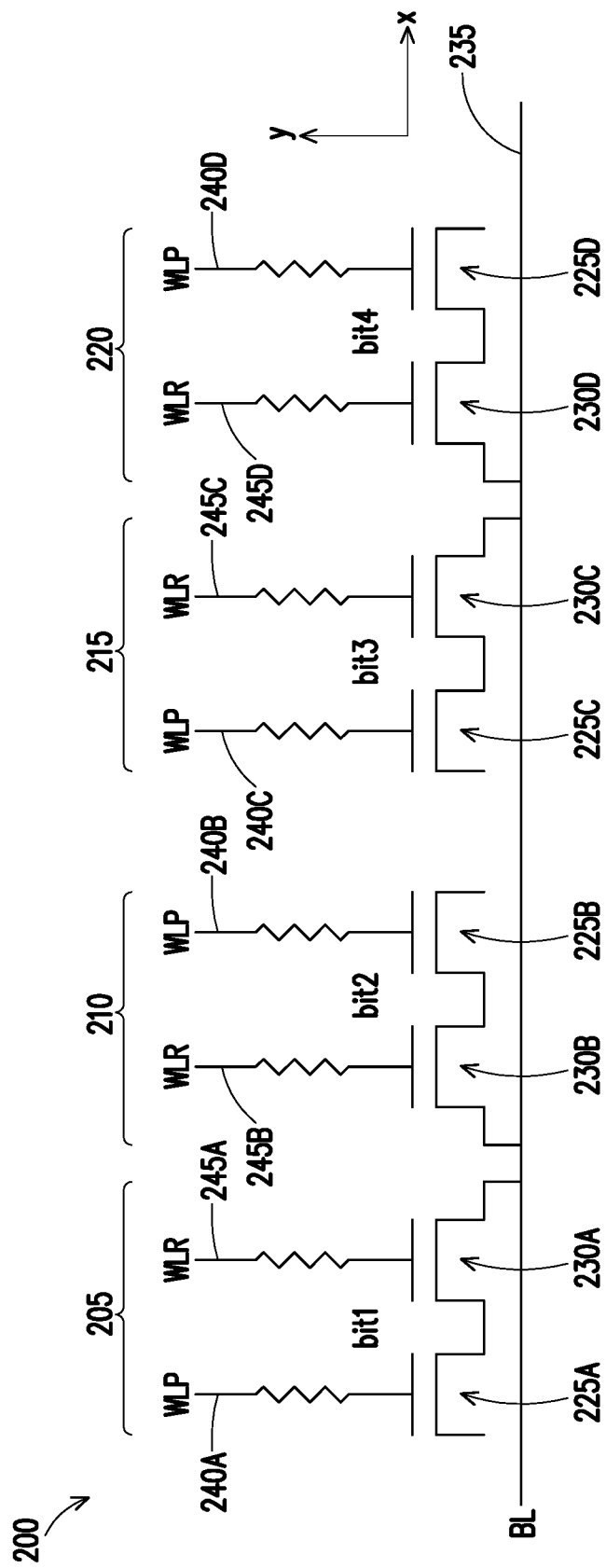
FIG. 2 is an example anti-fuse cell array, in accordance with some embodiments.

Turning to FIG. 2, an example anti-fuse cell array 200 is shown, in accordance with some embodiments of the present disclosure. The anti-fuse cell array 200 includes a first anti-fuse cell 205, a second anti-fuse cell 210, a third anti-fuse cell 215, and a fourth anti-fuse cell 220. In some embodiments, and as shown, each of the first anti-fuse cell 205, the second anti-fuse cell 210, the third anti-fuse cell 215, and the fourth anti-fuse cell 220 includes two transistors. Thus, each of the first anti-fuse cell 205, the second anti-fuse cell 210, the third anti-fuse cell 215, and the fourth anti-fuse cell 220 is a 2 T cell configuration. Further, each of the first anti-fuse cell 205, the second anti-fuse cell 210, the third anti-fuse cell 215, and the fourth anti-fuse cell 220 may be configured to store one bit of data in some embodiments.

Although four anti-fuse cells (e.g., the first anti-fuse cell 205, the second anti-fuse cell 210, the third anti-fuse cell 215, and the fourth anti-fuse cell 220) extending in a single cell row have been shown in the anti-fuse cell array 200, in some embodiments, greater than or fewer than four cells may be included in a single cell row, which extends in an X-direction, of the anti-fuse cell array. Further, while not shown in FIG. 2, the anti-fuse cell array 200 may include anti-fuse cells extending in a Y-direction as well. In other words, the anti-fuse cell array 200 may include a plurality of cell rows, with each cell row having a plurality of anti-fuse cells similar to the first anti-fuse cell 205, the second anti-fuse cell 210, the third anti-fuse cell 215, and the fourth anti-fuse cell 220.

Moreover, although each of the first anti-fuse cell 205, the second anti-fuse cell 210, the third anti-fuse cell 215, and the fourth anti-fuse cell 220 has been shown as being an n-type transistor, in some embodiments, one or more of the first anti-fuse cell, the second anti-fuse cell, the third anti-fuse cell, and the fourth anti-fuse cell may be a p-type transistor. The first anti-fuse cell 205, the second anti-fuse cell 210, the third anti-fuse cell 215, and the fourth anti-fuse cell 220 each include a program transistor 225A, 225B, 225C, and 225D, respectively, that is configured to store bits of data (e.g., one bit of data), and a read transistor 230A, 230B, 230C, and 230D, respectively, that is configured to facilitate reading of the data stored in the associated program transistor.

A source or drain terminal of the read transistor 230A-230D of each of the first anti-fuse cell 205, the second anti-fuse cell 210, the third anti-fuse cell 215, and the fourth anti-fuse cell 220 is connected to a bit line 235. Thus, each of the first anti-fuse cell 205, the second anti-fuse cell 210, the third anti-fuse cell 215, and the fourth anti-fuse cell 220 includes a program transistor (e.g., the program transistors 225A-225D) and a read transistor (e.g., the read transistors 230A-230D), and share the bit line 235. When a plurality of cell rows are provided in the anti-fuse cell array 200, the anti-fuse cells of each cell row may be associated with one bit line. Thus, the anti-fuse cell array 200 may include a plurality of bit lines in some embodiments.

Further, a gate terminal of the program transistor 225A-225D of each of the first anti-fuse cell 205, the second anti-fuse cell 210, the third anti-fuse cell 215, and the fourth anti-fuse cell 220 is connected to a program word line, WLP. Thus, the program transistor 225A of the first anti-fuse cell 205 is connected to a program word line 240A, the program transistor 225B of the second anti-fuse cell 210 is connected to a program word line 240B, the program transistor 225C of the third anti-fuse cell 215 is connected to a program word line 240C, and the program transistor 225D of the fourth anti-fuse cell 220 is connected to a program word line 240D. Each of the program word lines 240A-240D may be used to apply a programming voltage at a programming voltage level to program the associated one of the program transistors 225A-225D. Each of the program word lines 240A-240D may also be used to apply a read voltage at a read voltage level to read the data stored in the associated one of the program transistors 225A-225D.

To program a bit in the program transistor 225A, a programming voltage at the programming voltage level may be applied at the program word line 240A and a reference voltage may be applied at the bit line 235. A difference between the programming voltage and the reference voltage may produce an electric field across a dielectric semiconductor layer of the program transistor 225A. The electric field may be sufficiently large to sustainably alter (e.g., break down) the dielectric semiconductor layer of the program transistor 225A, thereby decreasing the resistance of the dielectric semiconductor layer and programming the data bit(s) in the program transistor. The program transistors 225B-225D may similarly be programmed via their respective one of the program word lines 240B-240D. The read transistor 230A-230D may be turned off during a programming operation.

Similarly, the gate terminal of the read transistors 230A-230D of each of the first anti-fuse cell 205, the second anti-fuse cell 210, the third anti-fuse cell 215, and the fourth anti-fuse cell 220 is connected to a read word line, WLR. For example, the read transistor 230A of the first anti-fuse cell 205 is connected to a read word line 245A, the read transistor 230B of the second anti-fuse cell 210 is connected to a read word line 245B, the read transistor 230C of the third anti-fuse cell 215 is connected to a read word line 245C, and the read transistor 230D of the fourth anti-fuse cell 220 is connected to a read word line 245D. Each of the read word lines 245A-245D may be used to apply a sufficient voltage to turn on the associated one of the read transistors 230A-230D for reading data stored in the associated one of the program transistors 225A-225D.

To read data stored within the program transistors 225A-225D, the associated one of the read transistors 230A-230D, respectively, may be turned on and a respective read voltage may be applied via the respective one of the program word lines 240A-240D. For example, to read data stored in the program transistor 225A, a sufficient voltage may be applied to the read word line 245A to turn on the read transistor 230A, a read voltage at a read voltage level may be applied at the program word line 240A, and a reference voltage may be applied to the bit line 235. A difference between the read voltage and the reference voltage creates an electric field across the dielectric semiconductor layer of the program transistor 225A. The electric field is sufficiently small to avoid sustainably altering the dielectric semiconductor layer, but large enough to generate a read current that flows through the read transistor 230A, which has been turned on. The read current flows through the bit line 235 and is sensed by a sense amplifier (not shown) connected to the bit line to read the bit(s) stored within the program transistor 225A. The magnitude and polarity of the read current may be dependent upon the magnitude and polarity of the read voltage applied at the program word line 240A relative to the reference voltage applied on the bit line 235, and one or more resistances discussed below. Similarly, the data stored in the program transistors 225B-225D may be read via the associated one of the read transistors 230B-230D, respectively, and the bit line 235.

Figure 3:
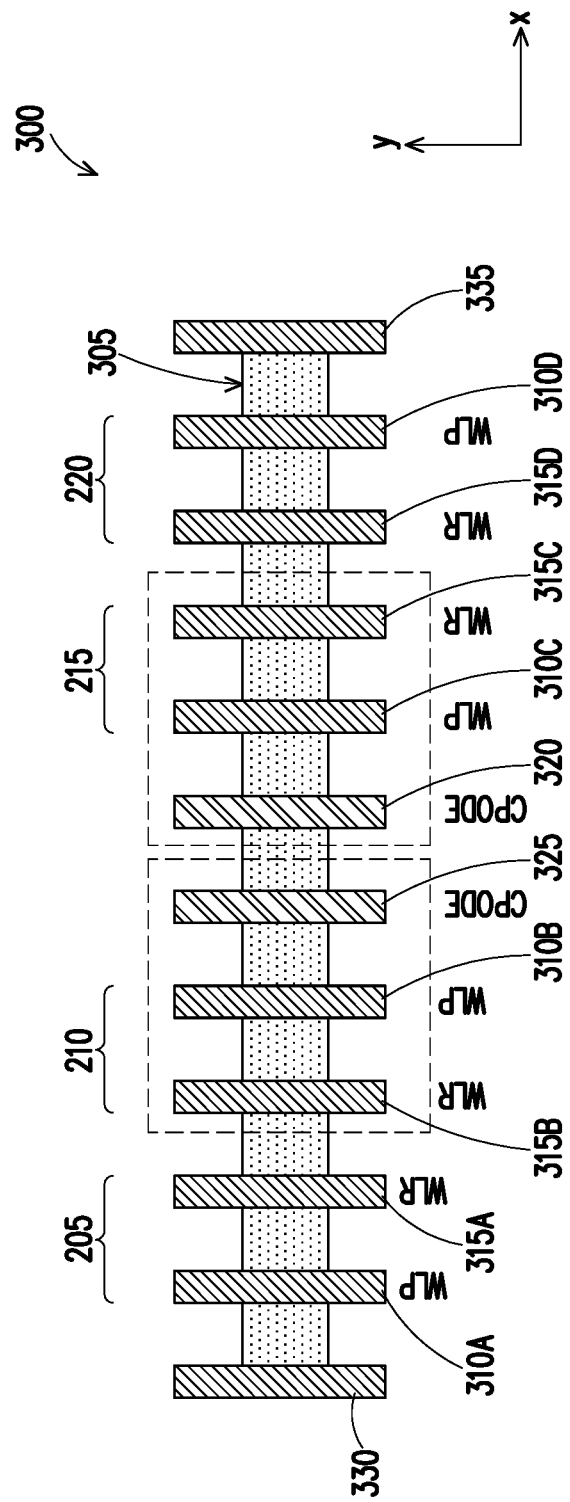
FIG. 3 is an example layout of the anti-fuse cell array of FIG. 2, in accordance with some embodiments.

Referring to FIG. 3, an example layout 300 of the anti-fuse cell array 200 is shown, in accordance with some embodiments of the present disclosure. Thus, the layout 300 includes the layout design of the first anti-fuse cell 205, the second anti-fuse cell 210, the third anti-fuse cell 215, and the fourth anti-fuse cell 220. The source and drain terminals of the program transistors 225A-225D and the read transistors 230A-230D of each of the first anti-fuse cell 205, the second anti-fuse cell 210, the third anti-fuse cell 215, and the fourth anti-fuse cell 220 are formed in an active region 305. The active region 305 may be connected (e.g., via an interconnect layer, not shown) to the bit line 235 (not shown in FIG. 2). The active region 305 may be a fin-shaped region of one or more three-dimensional field-effect-transistors (e.g., Fin-FETs, gate-all-around (GAA) transistors), or an oxide-definition (OD) region of one or more planar metal-oxide-semiconductor field-effect-transistors (MOSFETs), such that the active region may serve as a source feature or drain feature of the respective transistor(s). The active region 305 may extend along the cell row direction. Thus, the active region 305 may extend in the X-direction.

The gate terminals of each of the first anti-fuse cell 205, the second anti-fuse cell 210, the third anti-fuse cell 215, and the fourth anti-fuse cell 220 may be represented by a polysilicon line that extends perpendicular to the cell row direction. Thus, a polysilicon line extends in the Y-direction and intersects the active region 305. The program word lines 240A-240D and the read word lines 245A-245D may thus be connected to or otherwise associated with the polysilicon lines. The program word lines 240A-240D and the read word lines 245A-245D of each of the first anti-fuse cell 205, the second anti-fuse cell 210, the third anti-fuse cell 215, and the fourth anti-fuse cell 220 may be connected to a polysilicon line. For example, the program word line 240A-240D of the first anti-fuse cell 205, the second anti-fuse cell 210, the third anti-fuse cell 215, and the fourth anti-fuse cell 220, respectively, may be associated with respective polysilicon lines 310A-310D. Similarly, the read word lines 245A-245D of the first anti-fuse cell 205, the second anti-fuse cell 210, the third anti-fuse cell 215, and the fourth anti-fuse cell 220, respectively, may be associated with respective polysilicon lines 315A-315D.

In some embodiments, two anti-fuse cells may share an active region. For example, in some embodiments, the first anti-fuse cell 205 and the second anti-fuse cell 210 may be formed on one shared active region, while the third anti-fuse cell 215 and the fourth anti-fuse cell 220 may be formed on another shared active region. In such cases, a predetermined gap extending in the X-direction may be provided between the two shared active regions to reduce current leakage between the first anti-fuse cell 205/the second anti-fuse cell 210 and the third anti-fuse cell 215/the fourth anti-fuse cell 220. For example, in such embodiments, a predetermined gap may be provided between the polysilicon lines 310B and 310C. Although the gap reduces current leakage between adjacent/neighboring anti-fuse cells, the gap increases the overall cell area of the anti-fuse cell array 200.

To reduce the overall cell area of the anti-fuse cell array 200, the present disclosure, in various embodiments, provides a mechanism of enabling the first anti-fuse cell 205, the second anti-fuse cell 210, the third anti-fuse cell 215, and the fourth anti-fuse cell 220 to be formed on a common active region (e.g., the active region 305), as shown in FIG. 3. However, the active region 305 that is shared by the first anti-fuse cell 205, the second anti-fuse cell 210, the third anti-fuse cell 215, and the fourth anti-fuse cell 220 increases the current leakage between the anti-fuse cells of the anti-fuse cell array 200. To minimize the current leakage, the present disclosure, in some embodiments, also provides a mechanism of using a dummy polysilicon line over active region edge (also referred to herein as PODE) in the region where the gap would have been provided in conventional standard cell layouts. Since the active region 305 is continuous and shared by the first anti-fuse cell 205/the second anti-fuse cell 210 and the third anti-fuse cell 215/the fourth anti-fuse cell 220, the PODE may be considered a common PODE or continuous PODE (also referred to herein as CPODE).

A PODE or CPODE may be formed, in some embodiments, using a shallow trench isolation ("STI") technique. During fabrication of the anti-fuse cell array 200, the PODE or CPODE may be created by forming a trench in the semiconductor wafer on which the anti-fuse cell array is being fabricated, and the trench may be deposited with a dielectric material. By virtue of using a dielectric material, the PODE or CPODE does not provide an electrical or conductive path, and may prevent or at least reduce/minimize current leakage across components between which the PODE or CPODE is located.

Thus, in various embodiments, to use the common active region (e.g., the active region 305) and avoid current leakage between the active region portion of the first anti-fuse cell 205/the second anti-fuse cell 210 and the active region portion of the third anti-fuse cell 215/the fourth anti-fuse cell 220, a CPODE 320 and a CPODE 325 may be provided between the polysilicon lines 310B and 310C. The CPODE 320 and the CPODE 325 are not connected to the active region 305. Thus, the CPODE 320 and the CPODE 325 do not provide an electrical path between the polysilicon lines 310B and 310C. By using the CPODE 320 and the CPODE 325, the active region 305, in various embodiments, may be a common active region between the first anti-fuse cell 205/the second anti-fuse cell 210 and the third anti-fuse cell 215/the fourth anti-fuse cell 220 to eliminate the gap discussed above, thereby reducing the overall cell area of the anti-fuse cell array 200, while preventing or at least reducing/minimizing current leakage between adjacent/neighboring cells.

Although two CPODE (e.g., the CPODE 320 and the CPODE 325) are shown between the polysilicon lines 310B and 310C, in some embodiments, greater than or fewer than two CPODE may be provided between those polysilicon lines. Further, although the present disclosure has been discussed as forming the CPODE 320 and the CPODE 325 between the second anti-fuse cell 210 and the third anti-fuse cell 315 (e.g., since those cells are typically formed on separate active regions), in some embodiments, one or more CPODE may instead or additionally be provided between each neighboring anti-fuse cell. For example, in some embodiments, one or more CPODE may be provided between the first anti-fuse cell 205 and the second anti-fuse cell 210, one or more CPODE may be provided between the second anti-fuse cell and the third anti-fuse cell 215, and/or one or more CPODE may be provided between the third anti-fuse cell and the fourth anti-fuse cell 220 depending upon how the active regions of those anti-fuse cells are structured.

Further, in some embodiments, the program word line 240A-240D may be considered a bigger source of current leakage than the read program line 245A-245D. Thus, in some embodiments, it may be advantageous to position a CPODE adjacent to program word lines of adjacent anti-fuse cells. For example, in some embodiments, instead of, or in addition to, providing the CPODE 320 and 325, one or more CPODE may be provided adjacent to, and between, the polysilicon line 310A and polysilicon line 330, and one or more CPODE may be provided adjacent to, and between, the polysilicon line 310D and polysilicon line 335. In other embodiments, one or more CPODE may be provided adjacent to the read word line 245A-345B of adjacent anti-fuse cells in addition to, or instead of, providing one or more CPODE adjacent to the program word line 240A-240D and/or the CPODE 320, 325. For example, in some embodiments, one or more CPODE may be provided between the polysilicon lines 315A and 315B, and one or more CPODE may be provided between the polysilicon lines 315C and 315D.

Thus, in various embodiments, the CPODE enables using a common active region (e.g., the active region 305) to reduce both cell area of the anti-fuse cell array 200, and current leakage between adjacent anti-fuse cells. Inventors have found that using the CPODE (e.g., the CPODE 320 and the CPODE 325) may reduce overall cell area of the anti-fuse cell array 200 by about thirty four percent in various embodiments. The term "adjacent" or "neighboring" anti-fuse cells as used herein means that two anti-fuse cells are next to each other without any other intervening anti-fuse cells. Thus, in the anti-fuse cell array 200, the first anti-fuse cell 205 is adjacent to the second anti-fuse cell 210, the second anti-fuse cell is adjacent to the first anti-fuse cell and the third anti-fuse cell 215, the third anti-fuse cell is adjacent to the second anti-fuse cell and the fourth anti-fuse cell 220, and the fourth anti-fuse cell is adjacent to the third anti-fuse cell.

The overall cell area of the anti-fuse cell array 200 may be further reduced by using the layout described below in FIG. 4. Specifically, by using the layout of FIG. 4, the overall area of the anti-fuse cell array 200 may be reduced by about forty five percent. Thus, turning to FIG. 4, an alternate layout 400 is shown, in accordance with some embodiments of the present disclosure. Portion 405 of the layout 400 corresponds to the layout of the anti-fuse cell array 200. By using the layout 400 in the portion 405, the overall cell area of the anti-fuse cell array 200 may be reduced by about forty five percent (compared to the about thirty four percent of the layout 300) while preventing or at least reducing/minimizing current leakage, thereby providing a greater benefit than the layout 300. The layout 400 achieves a greater reduction in the overall cell area by using a combination of a polysilicon line and CPODE for the gate terminal associated with a program word line, and using a cross-arrangement of CPODE, as discussed below.

The portion 405 shows a layout 410A of the first anti-fuse cell 205. The layout 410A includes a polysilicon line 415A to represent the read word line 245A of the first anti-fuse cell 205. The layout 410A also includes a combination of a polysilicon line 425A and a CPODE 430A to represent the program word line 240A of the first anti-fuse cell 205. The portion 405 similarly includes a layout 410B of the second anti-fuse cell 210, a layout 410C of the third anti-fuse cell 315, and a layout 410D of the fourth anti-fuse cell 220. For legibility, a box is only shown around the layout 410A for the first anti-fuse cell 205. Similar to the layout 410A, each of the layout 410B-410D includes a polysilicon line to represent the read word line of the respective anti-fuse cell, and a combination of a polysilicon line and CPODE for the program word line of the respective anti-fuse cell.

For example, the layout 410B includes a polysilicon line 415B to represent the read word line 245B of the second anti-fuse cell 210, the layout 410C includes a polysilicon line 415C to represent the read word line 245C of the third anti-fuse cell 215, and the layout 410D includes a polysilicon line 415D to represent the read word line 245D of the fourth anti-fuse cell 220. Each of the polysilicon lines 415A-415D intersects both a first active region 420A and a second active region 420B. Further, each of the layout 410B-410D also includes a combination of a polysilicon line and a CPODE to represent the program word line of the respective anti-fuse cell. For example, the layout 410B includes a polysilicon line 425B and a CPODE 430B to represent the program word line 240B of the second anti-fuse cell 210, the layout 410C includes a polysilicon line 425C and a CPODE 430C to represent the program word line 240C of the third anti-fuse cell 215, and the layout 410D includes a polysilicon line 425D and a CPODE 430D to represent the program word line 240D of the fourth anti-fuse cell 220. Thus, each of the program word line 240A-240D is represented in the layout 400 by a combination of a respective one of the polysilicon line 425A-425D and a respective one of the CPODE 430A-430D.

Additionally, in some embodiments, each of the polysilicon line 425A-425D and each of the CPODE 430A-430D intersects either the first active region 420A or the second active region 420B. Specifically, in some embodiments, if the polysilicon line (e.g., the polysilicon line 425A-425D) associated with a particular program word line intersects the first active region 420A, the CPODE of that program word line intersects the second active region 420B. Thus, for example, in some embodiments, the polysilicon line 425A of the program word line 240A intersects the second active region 420B, while the CPODE 430A of that program word line intersects the first active region 420A. Similarly, in some embodiments, for each of the program word line 240B-240D, the polysilicon line 425B-425D and the CPODE 430B-430D associated with those program word lines intersects either the first active region 420A or the second active region 420B. Although not shown in the layout 400, the bit line 235 is connected to the first active region 420A and the second active region 420B.

Further, in some embodiments, a particular polysilicon line and the associated CPODE of a program word line are separated from each other by a small gap in the Y-direction. For example, in some embodiments, the polysilicon line 425A is separated from the CPODE 430A in the Y-direction by a small gap. Similarly, in some embodiments, the polysilicon line 425B, 425C, and 425D are each separated from the CPODE 430B, 430C, and 430D, respectively, by a small gap in the Y-direction. The size of the gap may vary from one embodiment to another. Further, in some embodiments, the gap between the polysilicon line 425A-425D and the CPODE 430A-430D of each of the program word line 240A-240D may be same, while in other embodiments, the gap may vary from one program word line to another. Thus, in contrast to the polysilicon line 415A-415B associated with the read word line 245A-245D, which extends as a continuous polysilicon line from the first active region 420A to the second active region 420B without a gap, the polysilicon line 425A-425D and the CPODE 430A-430B of each of the program word line 240A-240D are separated by a gap. In some embodiments, the polysilicon line 425A-425D and the CPODE 430A-430B of one or more of the program word line 240A-240D need not be separated by any gap. In some embodiments and as shown, the polysilicon line 425A-425D and the CPODE 430A-430B associated with a particular program word line may be aligned along the Y-direction (e.g., may be in one straight vertical line). In other embodiments, the polysilicon line 425A-425D and the CPODE 430A-430B associated with a particular program word line may be somewhat offset in the X-direction.

Additionally, in some embodiments, the polysilicon line 425A-425D and the CPODE 430A-430B are provided in a cross-arrangement. Specifically and as shown in FIG. 4, in some embodiments, if the CPODE associated with a program word line of one anti-fuse cell intersects the first active region 420A, the CPODE associated with the program word line of an adjacent anti-fuse cell intersects the second active region 420B. For example, since the CPODE 430A associated with the program word line 240A of the first anti-fuse cell 205 intersects the first active region 420A, the CPODE 430B associated with the program word line 240B of the second anti-fuse cell 210 intersects the second active region 420B. Similarly, the CPODE 430C associated with the program word line 430C of the third anti-fuse cell 215 intersects the first active region 420A (since the COPDE 430B associated with the program word line 430B of the second anti-fuse cell 215 and the CPODE 430D associated with the program word line 430D of the fourth anti-fuse cell 220 both intersect the second active region 420B). Thus, the CPODE associated with the program word line of one anti-fuse cell is formed on the first active region 420A, while the CPODE associated with the program word line of an adjacent anti-fuse cell is formed on the second active region 420B, thereby alternating between the first active region and the second active region. This alternate arrangement of the CPODE 430A-430D on the first active region 420A and the second active region 420B in adjacent anti-fuse cells is referred to herein as the cross-arrangement of the CPODE.

Figure 4:
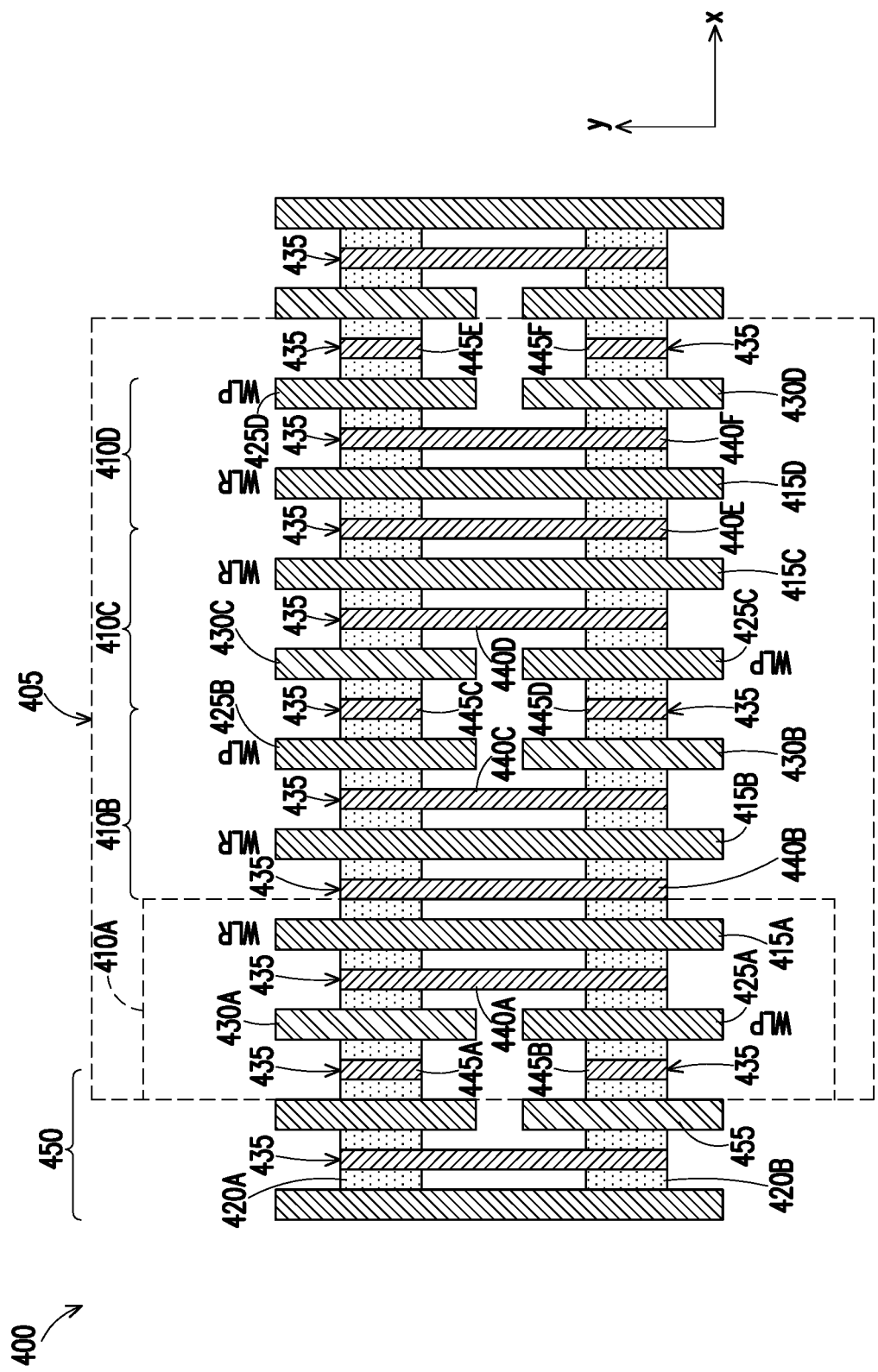
FIG. 4 is another example layout of the anti-fuse cell array of FIG. 2, in accordance with some embodiments.

Further and as shown in FIG. 4, in some embodiments, the first active region 420A and the second active region 420B are spaced apart from one another. The size of the space between the first active region 420A and the second active region 420B may vary from one embodiment to another. The first active region 420A and the second active region 420B are also connected to each other via one or more metal over diffusion layers provided between the polysilicon lines 415A-415D and 425A-425D, and the CPODE 430A-430D. For example, in some embodiments, the first active region 420A may be connected to the second active region 420B via a metal over diffusion layer 435. The metal over oxide layer 435 provides an electrical or conductive path between the first active region 420A and the second active region 420B. Except between adjacent program word lines, the metal over diffusion layer 435 extends continuously from the first active region 420A to the second active region 420B, thereby intersecting both the first active region and the second active region.

"Adjacent program word lines" means that the polysilicon line (or CPODE) associated with one program word line of an anti-fuse cell is next to the CPODE (or polysilicon line) associated with the program word line of an adjacent anti-fuse cell, without any other intervening polysilicon line or CPODE that are associated with a program word line or a read word line. Thus, for example, the polysilicon line 425C/the CPODE 430C and the polysilicon line 425B/the CPODE 430B are adjacent program word lines. However, the polysilicon line 425C/the CPODE 430C and the polysilicon line 425D/the CPODE 430D are not adjacent program word lines. Similarly, "adjacent read word lines" means that the polysilicon line associated with one read word line is next to another polysilicon line associated with another read word line, without any other intervening polysilicon line that are associated with a program word line or a read word line. Thus, for example, the polysilicon line 415C and the polysilicon line 415 are adjacent read word lines. However, the polysilicon line 415C and the polysilicon line 415B are not adjacent read word lines.

Thus, metal over diffusion layers 440A-440F in the portion 405 extend continuously between, and intersect, the first active region 420A and the second active region 420B, while metal over oxide layers 445A-445F in the portion 405 intersect either the first active region or the second active region. The metal over diffusion layers 440A-440F are referred to herein as "continuous metal over diffusion"

layers, while the metal over diffusion layers 445A-445F are referred to herein as "discontinuous metal over diffusion" layers. The metal over diffusion layers 445A-445F are positioned between adjacent program word lines. For example, the metal over diffusion layer 445C is between the polysilicon line 425B and the CPODE 430C, which are adjacent program lines. Similarly, the metal over diffusion layer 445D is between the CPODE 430B and the polysilicon line 425C, which are adjacent program word lines.

By spacing apart the first active region 420A and the second active region 420B, by using a combination of a polysilicon line (e.g., the polysilicon line 425A-425D) and CPODE (e.g., the CPODE 430A-430D) for a program word line, and by using a combination of continuous metal over diffusion layers (e.g., the metal over diffusion layers 440A-440F) and discontinuous metal over diffusion layers (e.g., the metal over diffusion layers 445A-445F), the present disclosure prevents or at least reduces or minimizes current leakage to/from neighboring anti-fuse cells, while reducing the overall cell area of the anti-fuse cell array 200.

For example and looking at the layout 410A in particular, the current may flow through the polysilicon line 425A to the polysilicon line 415A via the first active region 420A, the second active region 420B, and the metal over oxide layer 440A. However, the current flowing through the polysilicon line 425A may be prevented from flowing to neighboring anti-fuse cell 450 due to the CPODE 430A and CPODE 455, which provide an electrical isolation between the first anti-fuse cell 205 and the neighboring anti-fuse cell 450. Further, by using the CPODE 430A-430D, each of the first active region 420A and the second active region 420B may be formed as a continuous active region that is shared by all the anti-fuse cells in the same cell row, as discussed above in FIG. 3. Thus, the cross-arrangement of the CPODE reduces overall cell area of the anti-fuse cell array 200, while preventing or reducing/minimizing current leakage to neighboring anti-fuse cells.

It is to be understood that although a single instance of either the continuous metal over diffusion layers (e.g., the metal over oxide layers 440A-440F) or discontinuous metal over diffusion layers (e.g., the metal over oxide layers 445A-445F) is shown in each location in which those layers are present, in some embodiments, more than one metal diffusion layer may be provided in one or more of those locations. Further, in some embodiments, more than a single CPODE may be associated with each polysilicon line. Thus, in some embodiments, instead of a combination of one polysilicon line and one CPODE, each program word line may be associated with a combination of one polysilicon line and more than one CPODE. In some embodiments, more than one polysilicon line may be associated with each program word line.

Further, although two active regions (e.g., the first active region 420A and the second active region 420B) are shown in FIG. 4, in some embodiments, the layout 400 may include more than two active regions. Further, it is to be understood that only some elements of the layout 400 are shown in FIG. 4. Nevertheless, other elements such as metal interconnect layers, via contacts, power rails, etc., that are commonly included in standard cell layouts or may be considered desirable to have in standard cell layouts, may be provided. In some embodiments, the current leakage in the layout 400 of FIG. 4 may be further reduced by using additional CPODE, as described in the layout of FIG. 5 below.

Figure 5:
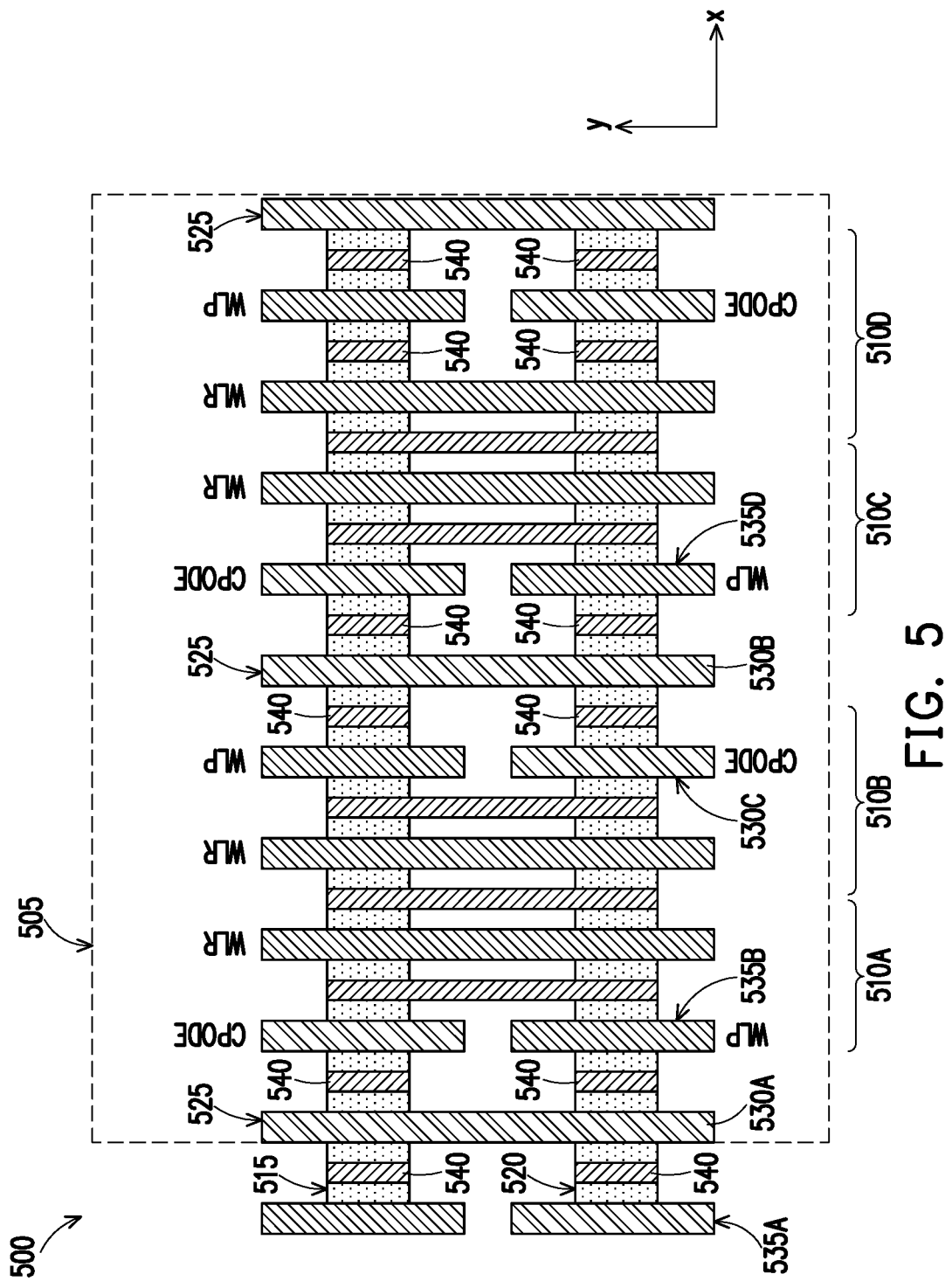
FIG. 5 is yet another example layout of the anti-fuse cell array of FIG. 2, in accordance with some embodiments.

Referring now to FIG. 5, another example layout 500 is shown, in accordance with some embodiments of the present disclosure. The layout 500 is similar to the layout 400, and thus, has not been described fully again. The layout 500 includes a portion 505 that corresponds to the layout of the anti-fuse cell array 200. Similar to the portion 405, the portion 505 includes a layout 510A for the first anti-fuse cell 205, a layout 510B for the second anti-fuse cell 210, a layout 510C for the third anti-fuse cell 215, and a layout 510D for the fourth anti-fuse cell 220. Each of the layout 510A-510D includes a polysilicon line for the read word line that intersects both a first active region 515 and a second active region 520. Each of the layout 510A-510D also includes a combination of a polysilicon line and a CPODE associated with a program word line. The polysilicon line and the CPODE are spaced apart and intersect either the first active region 515 or the second active region 520. Further, the layout 500 provides the cross-arrangement of the CPODE such that the placement of the CPODE alternates between positioning on the first active region 515 and the second active region 520, as discussed above. The portion 505 also includes one or more metal over diffusion layers to connect the first active region 515 to the second active region 520, while preventing or reducing/minimizing leakage to/from neighboring anti-fuse cells.

In contrast to the layout 400, the layout 500 also includes additional CPODE 525. In some embodiments, the CPODE 525 extends continuously from the first active region 515 to the second active region 520, thereby intersecting both the first active region and the second active region. In some embodiments, the CPODE 525 may be provided between adjacent program word lines. For example, a CPODE 530A may be provided between polysilicon line 535A (represented by a combination of a polysilicon line and a CPODE) and program word line 535B (also represented by a combination of a polysilicon line and a CPODE). Similarly, CPODE 530B may be provided between program word lines 535C and 535D. Although a single instance of the CPODE 525 is provided between adjacent program word lines, in some embodiments, more than one CPODE may be provided between the adjacent program word lines. The CPODE 525 further prevent or reduce/minimize current leakage to/from neighboring anti-fuse cells. In some embodiments, each instance of the CPODE 525 may be flanked on either side by a discontinuous metal over diffusion layer 540. Thus, instead of a single set of discontinuous metal over diffusion layer (e.g., the metal over oxide layers 445A-445F) between adjacent program word lines of FIG. 4, the layout 500 includes two sets of the discontinuous metal over diffusion layer 540 between adjacent program word lines.

Figure 6:
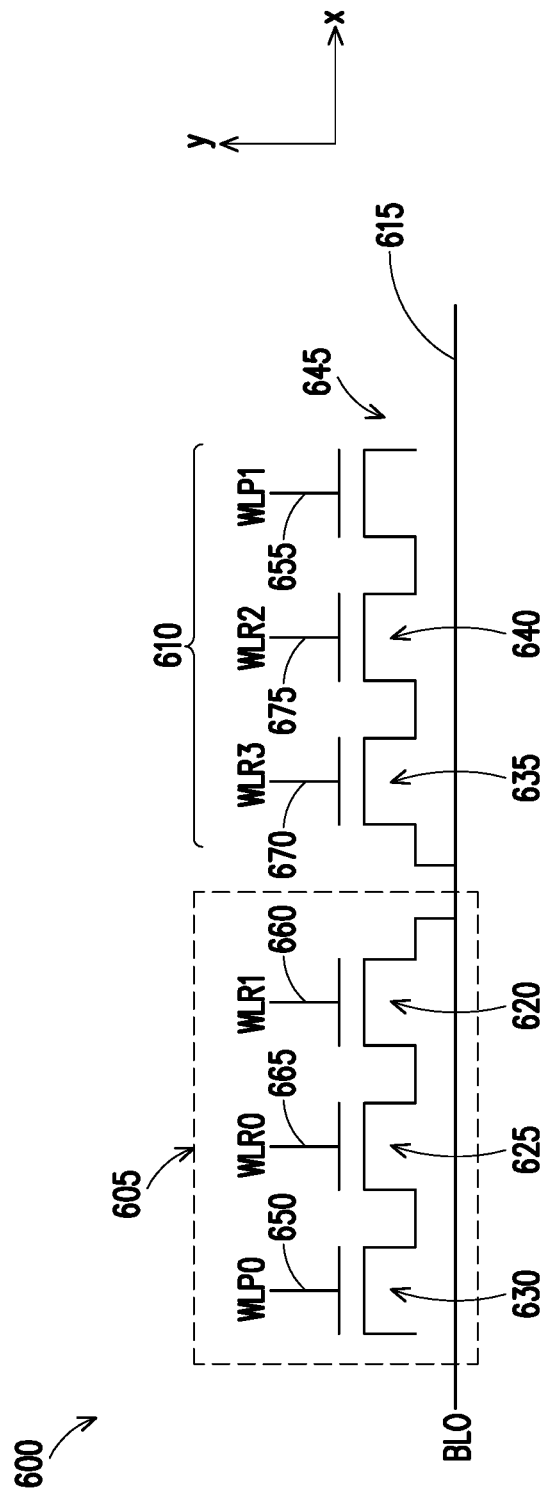
FIG. 6 is another example anti-fuse cell array, in accordance with some embodiments.
Figure 7:
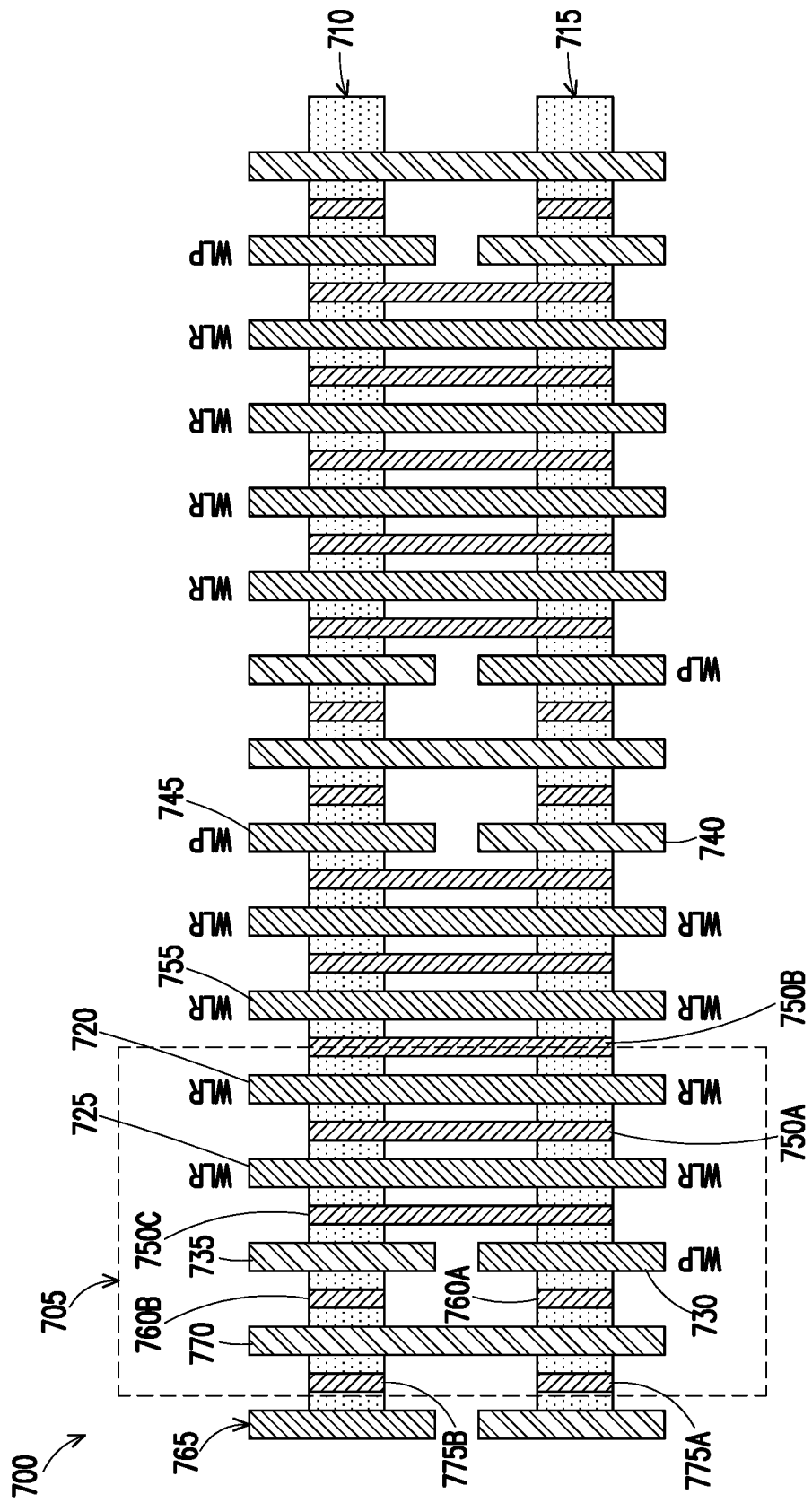
FIG. 7 is an example layout of the anti-fuse cell array of FIG. 6, in accordance with some embodiments.

While FIGS. 2-5 above describe the layouts of a 2 T configuration cell (e.g., the anti-fuse cell array 200), FIGS. 6 and 7 below describe the layout of a 3 T configuration cell. Thus, turning to FIG. 6, an example anti-fuse cell array 600 is shown, in accordance with some embodiments of the present disclosure. The anti-fuse cell array 600 is a 3 T configuration. In other words, the anti-fuse cell array 600 includes three transistors in each anti-fuse cell. The anti-fuse cell array 600 is shown to include a first anti-fuse cell 605 and a second anti-fuse cell 610 in a cell row extending in the X-direction. Although only two anti-fuse cells are shown in the anti-fuse cell array 600 in a cell row, in other embodiments, greater than two anti-fuse cells may be included in the anti-fuse cell array in the cell row. Further, although only a single cell row of anti-fuse cells is shown in the anti-fuse cell array 600, in other embodiments, a plurality of cell rows, with each cell row having a plurality of anti-fuse cells may be provided.

Each of the first anti-fuse cell 605 and the second anti-fuse cell 610 is connected to a bit line 615. When multiple cell rows are provided, each cell row may be connected to one bit line, thereby having multiple bit lines in the anti-fuse cell array 600. Further, each of the first anti-fuse cell 605 and the second anti-fuse cell 610 includes a program transistor and two read transistors. For example, the first anti-fuse cell 605 includes a first read transistor 620 and a second read transistor 625, and a program transistor 630. Similarly, the second anti-fuse cell 610 includes a first read transistor 635, a second read transistor 640, and a program transistor 645. A first terminal (e.g., source or drain) of the first read transistor 620 of the first anti-fuse cell 605 is connected to the bit line 615, while a second terminal (e.g., drain or source) of the first read transistor is connected to the first terminal (e.g., drain or source) of the second read transistor 625. The second terminal (e.g., source or drain) of the second read transistor 625 is connected to a first terminal (source or drain) of the program transistor 630. The second terminal (e.g., drain or source) of the program transistor 630 is floating. The second anti-fuse cell 610 is similarly connected. Although the various transistors in the first anti-fuse cell 605 and the second anti-fuse cell 610 are shown to be n-type transistors, in other embodiments, p-type transistors may be used.

The gate terminal of each of the program transistor 630 and 645 is connected to a program word line. For example, the gate terminal of the program transistor 630 is connected to a program word line 650, and the gate terminal of the program transistor 645 is connected to a program word line 655. The gate terminal of each of the read transistors is connected to a read word line. For example, the gate terminal of the first read transistor 620 is connected to a first read word line 660, while the gate terminal of the second read transistor 625 is connected to a second read word line 665. Similarly, the gate terminal of the first read transistor 635 is connected to a first read word line 670, while the gate terminal of the second read transistor 640 is connected to a second read word line 675.

The overall cell area of the anti-fuse cell array 600 may be reduced and current leakage in adjacent anti-fuse cells may be prevented or at least reduced/minimized by using the cross-arrangement of CPODE, as discussed in FIG. 7 below. Thus, referring to FIG. 7, an example layout 700 is shown, in accordance with some embodiments of the present disclosure. Portion 705 of the layout 700 corresponds to the layout of the first anti-fuse cell 605. The anti-fuse cell 610 may be laid out similar to the anti-fuse cell 605. The layout 700 is similar to the layouts 400 and 500 in which a cross-arrangement of CPODE is used to reduce the overall cell area, and prevent or at least reduce/minimize current leakage to/from adjacent anti-fuse cells.

Thus, in some embodiments, the layout 700 of the first anti-fuse cell 605 in the portion 705 includes a first active region 710 and a second active region 715 on which polysilicon lines form gate terminals of the first read transistor 620 and the second read transistor 625. For example, polysilicon line 720 may form the gate terminal of the first read transistor 620 to which the first read word line 660 is connected, and polysilicon line 725 may form the gate terminal of the second read transistor 625 to which the second read word line 665 is connected. In some embodiments, the polysilicon lines 720 and 725 extend continuously from the first active region 710 to the second active region 715, thereby intersecting both the first active region and the second active region.

In some embodiments, the gate terminal of the program transistor 630 to which the program word line 650 is connected may be formed as a combination of a polysilicon line and a CPODE. Thus, as discussed above, the gate terminal of the program transistor 630 may include a polysilicon line 730 and a CPODE 735, each of which intersect with either the first active region 710 or the second active region 715. For example and as shown in FIG. 7, the polysilicon line 730 intersects the second active region 715, while the CPODE 735 intersects the first active region 710. Due to the cross-arrangement of the CPODE, the second anti-fuse cell 610 may have its CPODE 740 of the program transistor 645 intersect the second active region 715, while polysilicon line 745 of that program transistor may intersect the first active region 710. Thus, in some embodiments, the CPODE alternates between the first active region 710 and the second active region 715 in adjacent anti-fuse cells. As a result, the polysilicon line associated with the CPODE also alternates between the second active region 715 and the first active region 710.

Further, in some embodiments, the first active region 710 and the second active region 715 may be interconnected by one or more metal over diffusion layers. In some embodiments, a metal over diffusion layer extending continuously from the first active region 710 to the second active region 715 may be provided between two adjacent read word lines, and between adjacent read word line and program word line. Thus, for example, a metal over diffusion layer 750A may be formed between the polysilicon lines 720 and 725. Similarly, a metal over diffusion layer 750B may be provided between the polysilicon line 720 and polysilicon line 755 associated with the first read word line 670 of the second anti-fuse cell 610. A metal over diffusion layer 750C may also be provided between the polysilicon line 725 representing the second read word line 665 and the polysilicon line 730/the CPODE 735 representing the program word line 650. Thus, a metal over diffusion layer may be provided between two adjacent read word lines. A metal over diffusion layer may also be provided between adjacent read and program word lines. "Adjacent read and program word lines" means that the polysilicon line (or CPODE) associated with one program word line is next to the polysilicon line associated with the read word line, without any other intervening polysilicon line or CPODE that are associated with a program word line or a read word line. Thus, for example, the polysilicon line 725 and the polysilicon line 730/the CPODE 735 are adjacent read and program word lines. However, the polysilicon line 720 and the polysilicon line 730/the CPODE 735 are not adjacent read and program word lines.

The metal over diffusion layers 750A-750C provide a conductive path between the first active region 710 and the second active region 715. Thus, in some embodiments, each of the metal over diffusion layers 750A-750C intersect both the first active region 710 and the second active region 715. Accordingly, the metal over diffusion layers 750A-750C are referred to herein as continuous metal over diffusion layers. In some embodiments, the layout 700 may also include discontinuous metal over diffusion layers between two adjacent program word lines. A discontinuous metal over diffusion layer intersects either the first active region 710 or the second active region 715, but not both. The discontinuous metal over diffusion layers provide an electrical isolation between the first active region 710 and the second active region 715, thereby preventing leakage to/from neighboring anti-fuse cells, as discussed above. For example, in some embodiments, the layout 700 may include metal over diffusion layers 760A and 760B between the program word line represented by the polysilicon line 730 and the CPODE 735, and a neighboring program word line 765. The metal over diffusion layer 760A intersects only the second active region 715, while the metal over diffusion layer 760B intersects only the first active region 710. Thus, the current flowing through the polysilicon line 730 and the second active region 715 is prevented from flowing into the first active region 710.

In some embodiments, an additional CPODE 770 may be provided, similar to the layout 500. In other embodiments, the CPODE 770 may be omitted, similar to the layout 400. The CPODE 670 may intersect both the first active region 710 and the second active region 715, and may be provided between two adjacent program word lines. Further, when the CPODE 670 is provided, in some embodiments, that CPODE may be sandwiched between metal over diffusion layers, such as the metal over diffusion layers 760A/760B and metal over diffusion layers 775A/775B. When the CPODE 670 is not provided, the metal over diffusion layers 775A/775B may be omitted. The metal over diffusion layers 775A/775B layers are discontinuous layers similar to the metal over diffusion layers 760A/760B. Thus, the metal over diffusion layers 775A/775B intersect either the first active region 710 or the second active region 715. The CPODE 770 provides additional protection from leakage between neighboring anti-fuse cells. When provided, the CPODE 770 is provisioned between adjacent program word lines, similar to that in the layout 500.

Although the layout 700 is discussed with respect to the portion 705 and the layout of the first anti-fuse cell 605, a similar layout may be provided for the second anti-fuse cell 610, and any additional anti-fuse cells in the anti-fuse cell array 600. Further, although a single continuous metal over diffusion layer is shown between two adjacent read word lines, or between an adjacent read and program word lines, in some embodiments, multiple metal over diffusion layers may be provided in at least some of adjacent reads word lines and at least some of adjacent read and program word lines. Additionally, although a single discontinuous metal over diffusion layer intersecting a particular active region is shown between two adjacent program word lines or between the additional CPODE (e.g., the CPODE 770) and an adjacent program word line, multiple such metal over diffusion layers may be provided in some embodiments, in either or both locations.

Figure 8:
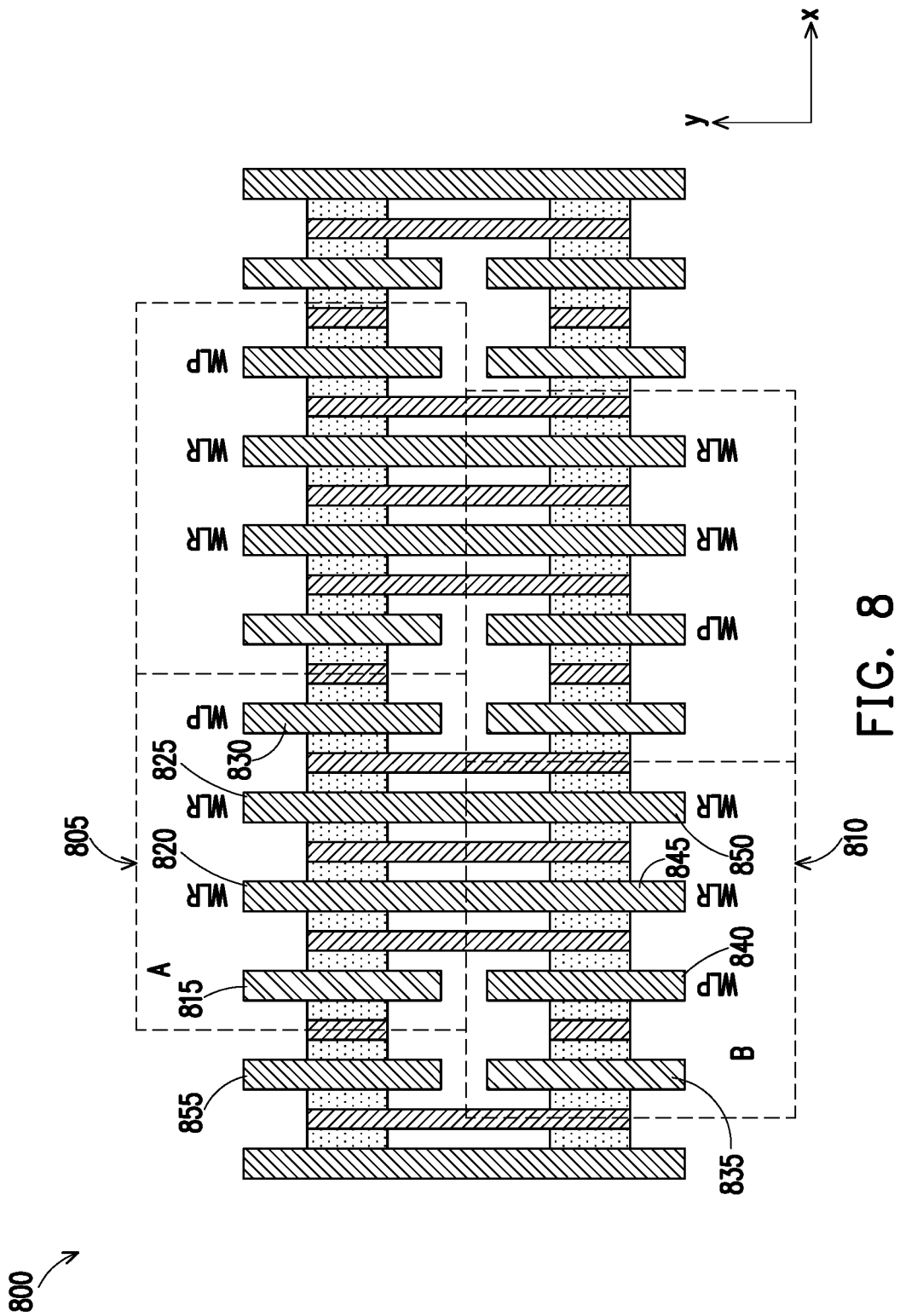
FIG. 8 is an example layout showing definition of a unit cell in the anti-fuse cell array of FIG. 2, in accordance with some embodiments.
Figure 9:
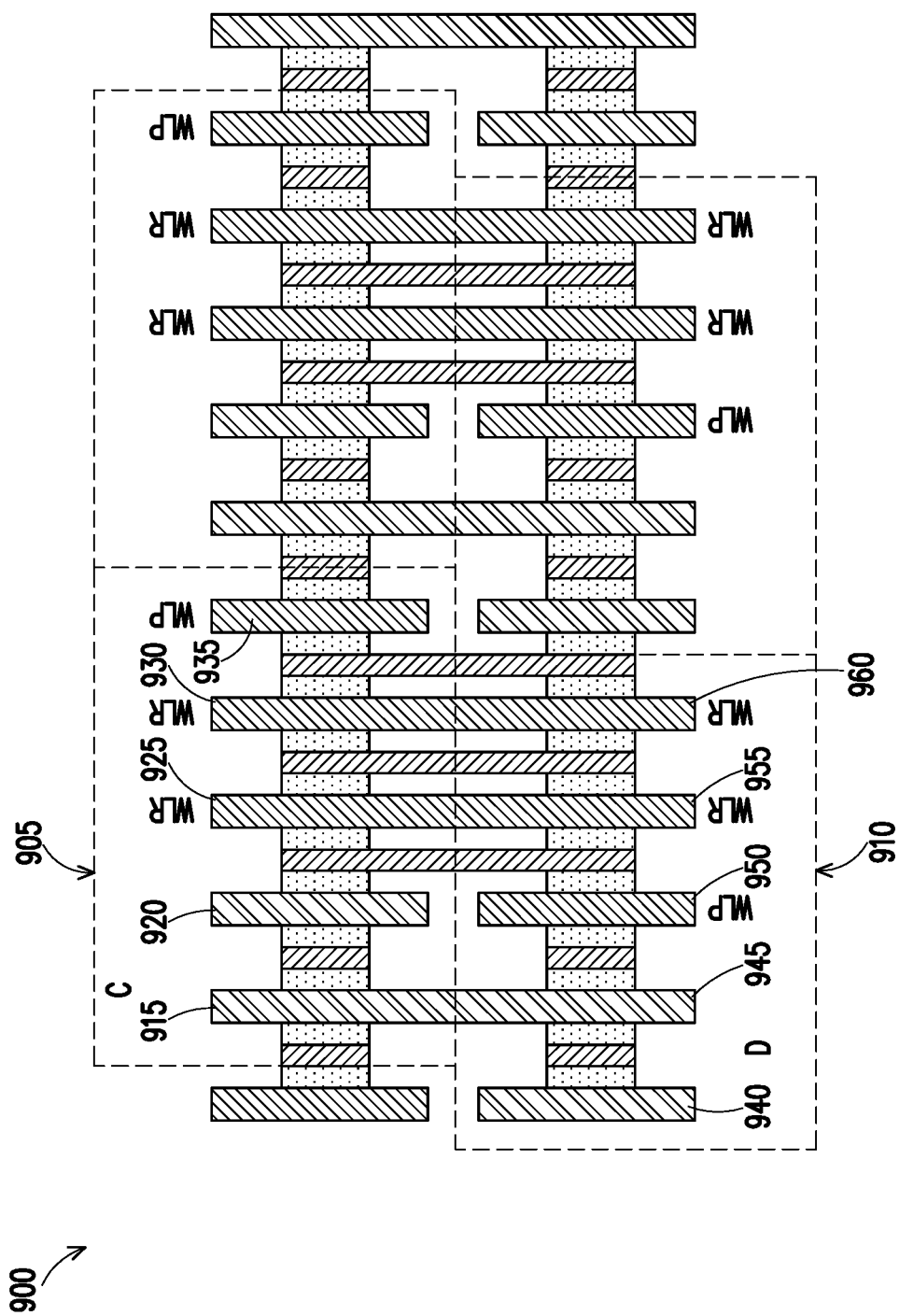
FIG. 9 is another example layout showing definition of another unit cell in the anti-fuse cell array of FIG. 2, in accordance with some embodiments.

In some embodiments, one or more unit cells may be defined, and the unit cells may be arranged to form the layouts 400, 500, and 700. FIG. 8 shows one example of defining the unit cells, while FIG. 9 shows another example of defining the unit cells.

Turning to FIG. 8, another example layout 800 is shown, in accordance with some embodiments of the present disclosure. The layout 800 is similar to the layout 400. The layout 800 shows definition of a unit cell that may be used to create the layout 400. For example, in some embodiments, the layout 800 may be created from a combination of a first cell ("A" cell) 805 and a second cell ("B" cell) 810. Each of the first cell 805 and the second cell 810 include an active region in which the source and drain terminals of an anti-fuse cell are formed, as well as one or more polysilicon lines and CPODE for the gate terminals of an anti-fuse cell. Further, each of the first cell 805 and the second cell 810 may represent two bits in a 2 T configuration or 1 bit in a 3 T configuration. The first cell 805 may include a CPODE 815 representing the gate terminal of the program word line, a first polysilicon line 820 ("WLR") representing the gate terminal of the read word line, a second polysilicon line 825 ("WLR") representing the gate terminal of the read word line, and a third polysilicon line 830 ("WLP") representing the gate terminal of the program word line. Thus, the first cell 805 may include CPODE>WLR*2>WLP, meaning the CPODE 815 is adjacent to two WLR (e.g., the first polysilicon line 820 and the second polysilicon line 825), which in turn are adjacent to WLP (e.g., the third polysilicon line 830).

The second cell 810 is a combination of a CPODE 835 for the program word line, a fourth polysilicon line 840 ("WLP") for another program word line, a fifth polysilicon line 845 ("WLR") for a read word line, and a sixth polysilicon line 850 ("WLR") for another read word line. Thus, the second cell 810 may include CPODE>WLP>WLR*2, meaning that the CPODE 835 is adjacent to WLP (e.g., the fourth polysilicon line 840), which in turn is adjacent to two WLR (e.g., the fifth polysilicon line 845 and the sixth polysilicon line 850). By using a combination of the first cell 805 and the second cell 810 in the X-direction and/or the Y-direction, the layout 800 having a cross-arrangement of the CPODE (e.g., the CPODE 815, 835) may be obtained. Each of the first cell 805 and the second cell 810 may be used one or more times in either the X-direction or the Y-direction or both.

Further, the first cell 805 in a first cell row may be shifted one polysilicon line pitch to the right in the X-direction with respect to the second cell 810 in a second cell row. Polysilicon line pitch may be defined as a center-to-center distance between a polysilicon line and an adjacent interconnect. For example, in FIG. 8, the polysilicon line pitch may be the center-to-center distance between the CPODE 815 and polysilicon line 855. Thus, when a combination of the first cell 805 and the second cell 810 is used to create the layout 800, the first cell may be shifted to the right by one polysilicon pitch with respect to the second cell. By shifting and placing multiple ones of the first cell 805 and the second cell 810, the layout 400 may be obtained. In some embodiments, the first cell 805 and the second cell 810 may be defined as a standard cell and stored in a standard cell library for creating the layout 400.

In some embodiments, the first cell 805 may be shifted by one polysilicon pitch to the left in the X-direction with respect to the second cell. In other embodiments, depending upon the layout, the first cell 805 may be shifted by greater than one polysilicon pitch. In some embodiments, the second cell 810 may be shifted by one or more polysilicon pitches with respect to the first cell 805. The first cell 805 and the second cell 810 may be used to create the layout of a 3 T configuration as well.

Referring to FIG. 9, an example layout 900 is shown, in accordance with some embodiments of the present disclosure. The layout 900 is similar to the layout 500. In some embodiments, a first cell 905 ("C" cell) in a first cell row and a second cell 910 ("D" cell) in a second cell row may be defined. Each of the first cell 905 and the second cell 910 may include an active region in which the source and drain terminals of an anti-fuse cell are formed, as well as one or more polysilicon lines and CPODE for the gate terminals of an anti-fuse cell. By placing a combination of the first cell 905 and the second cell 910 in the X-direction and the Y-direction, the layout 500 may be obtained having a cross-arrangement of the CPODE. Each of the first cell 905 and the second cell 910 may represent two bits in a 2 T configuration or one bit in a 3 T configuration. The first cell 905 may include a first CPODE 915 for the additional CPODE 525, a second CPODE 920 for the program word line, a first polysilicon line 925 ("WLR") for the read word line, a second polysilicon line 930 ("WLR") for the read word line, and a third polysilicon line 935 ("WLP") for the program word line. Thus, the first cell 905 may be defined by CPODE*2>WLR*2>WLP, meaning the first CPODE 915 is adjacent to the second CPODE 920, which in turn is adjacent to two WLR (e.g., the first polysilicon line 925 and the second polysilicon line 930), and which in turn are adjacent to WLP (e.g., the third polysilicon line 935).

The second cell 910 is a combination of a third CPODE 940, a fourth CPODE 945 for the program word line, a fourth polysilicon line 950 ("WLP") for another program word line, a fifth polysilicon line 955 ("WLR") for a read word line, and a sixth polysilicon line 960 ("WLR") for another read word line. Thus, the second cell 910 may be defined by CPODE*2>WLP>WLR*2, meaning that the third CPODE 940 and the fourth CPODE 945 are adjacent to WLP (e.g., the fourth polysilicon line 950), which in turn is adjacent to two WLR (e.g., the fifth polysilicon line 955 and the sixth polysilicon line 960).

Further, the first cell 905 in the first cell row may be shifted one polysilicon line pitch to the right in the X-direction with respect to the second cell 910 in the second cell row. In some embodiments, the first cell 905 may be shifted by one polysilicon pitch to the left in the X-direction with respect to the second cell 910. In other embodiments, depending upon the layout, the first cell 905 may be shifted by greater than one polysilicon pitch with respect to the second cell 910. In some embodiments, the second cell 910 may be shifted by one or more polysilicon pitches with respect to the first cell 905. By using a combination of the first cell 905 and the second cell 910 in the X-direction and/or the Y-direction, the layout 500 having a cross-arrangement of the CPODE may be obtained. Each of the first cell 905 and the second cell 910 may be used one or more times in either the X-direction or the Y-direction or both to obtain the layout 500. In some embodiments, the first cell 905 and the second cell 910 may be defined as a standard cell and stored in a standard cell library for creating the layout 500. Further, the first cell 905 and the second cell 910 may also be used to create the layout 700 having the 3 T configuration as well.

Thus, by using a cross-arrangement of CPODE, the overall cell area of an anti-fuse cell array may be reduced (e.g., because the active regions may be shared instead of being separated). Further, the current leakage to/from neighboring anti-fuse cells may be reduced. In some embodiments, the CPODE may be formed at a CPODE degree with respect to a adjacent polysilicon line in the substrate. In some embodiments, the CPODE degree may be greater than or equal to 45° and less than or equal to 135°. In other embodiments, other CPODE degrees that are considered suitable may be used.

In accordance with some aspects of the present disclosure, a memory device is disclosed. The memory device includes a first memory cell having a first polysilicon line associated with a first read word line and intersecting a first active region and a second active region; a second polysilicon line and a first continuous polysilicon line over active region edge ("CPODE") associated with a first program word line, the second polysilicon line intersecting the second active region and the first CPODE intersecting the first active region. The memory device also includes a second memory cell adjacent to the first memory cell, the second memory cell having a third polysilicon line associated with a second read word line and intersecting the first active region and the second active region; and a fourth polysilicon line and a second CPODE associated with a second program word line, the fourth polysilicon line intersecting the first active region and the second CPODE intersecting the second active region to form a cross-arrangement of CPODE.

In accordance with some other aspects of the present disclosure, a memory cell is disclosed. The memory cell includes a first transistor having a read word line connected to a first gate terminal of the first transistor, and a second transistor having a program word line connected to a second gate terminal of the second transistor. The first gate terminal includes a first polysilicon line intersecting a first active region and a second active region, and the second gate terminal includes a combination of a second polysilicon line intersecting the second active region and a continuous polysilicon line over active region edge ("CPODE") intersecting the first active region. The first active region and the second active region extend in a first direction, and the first polysilicon line, the second polysilicon line, and the CPODE extend in a second direction perpendicular to the first direction.

In accordance with yet other aspects of the present disclosure, a method is disclosed. The method includes placing a first cell in a first cell row having a first active region extending in a first direction, the first cell having a first continuous polysilicon line over active region edge ("CPODE"), a first polysilicon line associated with a first read word line, a second polysilicon line associated with a second read word line, and a third polysilicon line associated with a first program word line. The method also includes placing a second cell in a second cell row having a second active region extending in the first direction, the second cell having a second CPODE, a fourth polysilicon line associated with a second program word line, a fifth polysilicon line associated with a third read word line, and a sixth polysilicon line associated with a fourth read word line. The first cell is shifted by one polysilicon line pitch in the first direction with respect to the second cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device comprising:
   a first memory cell comprising:
      a first polysilicon line associated with a first read word line and intersecting a first active region and a second active region; and
      a second polysilicon line and a first continuous polysilicon line over active region edge ("CPODE") associated with a first program word line, the second polysilicon line intersecting the second active region and the first CPODE intersecting the first active region; and
   a second memory cell adjacent to the first memory cell, the second memory cell comprising:
      a third polysilicon line associated with a second read word line and intersecting the first active region and the second active region; and
      a fourth polysilicon line and a second CPODE associated with a second program word line, the fourth polysilicon line intersecting the first active region and the second CPODE intersecting the second active region to form a cross-arrangement of CPODE.

2. The memory device of claim 1, further comprising a third CPODE and a fourth CPODE sandwiching the first memory cell and the second memory cell, wherein each of the third CPODE and the fourth CPODE intersect the first active region and the second active region.

3. The memory device of claim 1, further comprising a metal over diffusion layer intersecting the first active region and the second active region, wherein the metal over diffusion layer is between two adjacent read word lines.

4. The memory device of claim 1, further comprising a metal over diffusion layer intersecting the first active region and the second active region, wherein the metal over diffusion layer is between adjacent read and program word lines.

5. The memory device of claim 1, wherein the second polysilicon line and the first CPODE are spaced apart in a second direction perpendicular to a first direction in which the first active region and the second active region extend.

6. The memory device of claim 1, wherein adjacent program word lines are separated by a metal over diffusion layer that intersects either the first active region or the second active region.

7. The memory device of claim 6, wherein the adjacent program word lines are further separated by a third CPODE intersecting the first active region and the second active region.

8. The memory device of claim 1, wherein the first memory cell further comprises a fifth polysilicon line associated with a third read word line and intersecting the first active region and the second active region, and wherein the second memory cells comprises a sixth polysilicon line associated with a fourth read word line and intersecting the first active region and the second active region.

9. A memory cell comprising:
a first transistor having a read word line connected to a first gate terminal of the first transistor; and
a second transistor having a program word line connected to a second gate terminal of the second transistor,
wherein the first gate terminal comprises a first polysilicon line intersecting a first active region and a second active region;
wherein the second gate terminal comprises a combination of a second polysilicon line intersecting the second active region and a continuous polysilicon line over active region edge ("CPODE") intersecting the first active region; and
wherein the first active region and the second active region extend in a first direction, and the first polysilicon line, the second polysilicon line, and the CPODE extend in a second direction perpendicular to the first direction.

10. The memory device of claim 9, wherein the second polysilicon line and the CPODE are aligned and spaced apart in the second direction.

11. The memory device of claim 9, further comprising a metal over diffusion layer extending in the second direction between the first polysilicon line and the second polysilicon line and intersecting the first active region and the second active region.

12. The memory device of claim 9, further comprising a third transistor having a second read word line connected to a third gate terminal of the third transistor, wherein the third gate terminal comprises a third polysilicon line extending in the second direction and intersecting the first active region and the second active region.

13. The memory device of claim 9, further comprising an additional CPODE extending in the second direction and intersecting the first active region and the second active region.

14. A memory device comprising:
a first anti-fuse memory cell comprising:
a first polysilicon line associated with a first program word line of the first anti-fuse memory cell, wherein the first polysilicon line intersects a first active region; and
a first continuous polysilicon line over active region edge ("CPODE"), wherein the first CPODE intersects a second active region; and
a second anti-fuse memory cell adjacent to the first anti-fuse memory cell, the second anti-fuse memory cell comprising:
a second polysilicon line associated with a second program word line of the second anti-fuse memory cell, wherein the second polysilicon line intersects the second active region; and
a second CPODE, wherein the second CPODE intersects the first active region to form a cross-arrangement of CPODE.

15. The memory device of claim 14, wherein the first anti-fuse memory cell further comprises a third polysilicon line associated with a first read word line, and wherein the third polysilicon line intersects the first active region and the second active region.

16. The memory device of claim 14, wherein the second anti-fuse memory cell further comprises a third polysilicon line associated with a second read word line, and wherein the third polysilicon line intersects the first active region and the second active region.

17. The memory device of claim 14, further comprising a third CPODE and a fourth CPODE sandwiching the first anti-fuse memory cell and the second anti-fuse memory cell, wherein each of the third CPODE and the fourth CPODE intersect the first active region and the second active region.

18. The memory device of claim 14, wherein the first polysilicon line and the first CPODE are spaced apart in a second direction perpendicular to a first direction in which the first active region and the second active region extend.

19. The memory device of claim 14, wherein adjacent program word lines are separated by a metal over diffusion layer that intersects either the first active region or the second active region.

20. The memory device of claim 14, wherein the first active region and the second active region are spaced apart in a second direction perpendicular to a first direction in which the first active region and the second active region extend.

* * * * *